(12) United States Patent
Senoo et al.

(10) Patent No.: US 10,573,853 B2
(45) Date of Patent: Feb. 25, 2020

(54) METHOD OF MANUFACTURING DISPLAY DEVICE

(71) Applicant: Sharp Kabushiki Kaisha, Sakai, Osaka (JP)

(72) Inventors: Tohru Senoo, Sakai (JP); Takeshi Hirase, Sakai (JP); Hisao Ochi, Sakai (JP); Takashi Ochi, Sakai (JP); Tohru Sonoda, Sakai (JP); Jumpei Takahashi, Sakai (JP); Akihiro Matsui, Sakai (JP); Yoshinobu Miyamoto, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 16/463,460

(22) PCT Filed: Sep. 22, 2017

(86) PCT No.: PCT/JP2017/034370
§ 371 (c)(1),
(2) Date: May 23, 2019

(87) PCT Pub. No.: WO2019/058528
PCT Pub. Date: Mar. 28, 2019

(65) Prior Publication Data
US 2019/0372061 A1 Dec. 5, 2019

(51) Int. Cl.
*H01L 51/56* (2006.01)
*G09F 9/30* (2006.01)
(Continued)

(52) U.S. Cl.
CPC .............. *H01L 51/56* (2013.01); *G09F 9/30* (2013.01); *H01L 27/3246* (2013.01); *H01L 51/0031* (2013.01); *H01L 51/5253* (2013.01)

(58) Field of Classification Search
None
See application file for complete search history.

(56) References Cited

U.S. PATENT DOCUMENTS

| 6,841,399 B2 * | 1/2005 | Hasegawa | G03F 1/56 |
| | | | 430/5 |
| 2011/0287682 A1 * | 11/2011 | Miyazawa | H01L 27/3246 |
| | | | 445/2 |

(Continued)

FOREIGN PATENT DOCUMENTS

| JP | 2010-218940 A | 9/2010 |
| JP | 2017-054781 A | 3/2017 |

(Continued)

OTHER PUBLICATIONS

Official Communication issued in International Patent Application No. PCT/JP2017/034370, dated Nov. 28, 2017.

*Primary Examiner* — Michelle Mandala
(74) *Attorney, Agent, or Firm* — Keating & Bennett, LLP

(57) ABSTRACT

A method of manufacturing a display device includes a step of forming a first inorganic film constituting a sealing film and a step of forming an organic film constituting the sealing film. Between these steps, the method further includes a foreign matter inspection step of inspecting a substrate surface on which the first inorganic film has been formed and identifying the location of a foreign matter adhering to the substrate surface, and a partial ejection step of using an ink-jet method to eject ink to be formed a part of the organic film at the location of the foreign matter on the substrate surface identified in the foreign matter inspection step.

7 Claims, 6 Drawing Sheets

(51) Int. Cl.
*H01L 27/32* (2006.01)
*H01L 51/00* (2006.01)
*H01L 51/52* (2006.01)

(56) References Cited

U.S. PATENT DOCUMENTS

2016/0095172 A1   3/2016   Lee et al.
2016/0172592 A1   6/2016   Ito

FOREIGN PATENT DOCUMENTS

JP   2017-061606 A    3/2017
WO   2015/162891 A1   10/2015

\* cited by examiner

METHOD OF MANUFACTURING DISPLAY DEVICE

TECHNICAL FIELD

The disclosure relates to a method of manufacturing a display device.

BACKGROUND ART

In recent years, organic EL display devices, which use organic electroluminescence (EL) elements and are of the self-luminous type, have attracted attention as display devices that can replace liquid crystal display devices. For the organic EL display device, a seal structure is proposed to inhibit degradation of the organic EL element due to penetration of, for example, moisture and oxygen. The seal structure includes a sealing film covering the organic EL element, and the sealing film includes a stack of an inorganic film and an organic film.

For example, PTL 1 discloses an organic EL device in which an SiNx film is layered on the surface of an organic EL element through sputtering, after which an organic film is formed by applying a curable composition using an inkjet ejection apparatus and curing the composition. Finally, an SiNx film is layered through sputtering.

CITATION LIST

Patent Literature

PTL 1: JP 2017-61606 A

SUMMARY

Technical Problem

In a sealing film such as that in the organic EL device disclosed in the above-described PTL 1, in which an inorganic film, an organic film, and an inorganic film are layered in that order, the organic film may be formed using an ink-jet method. In this case, if foreign matters are present on the surface of the inorganic film prior to the organic film being formed, it is easy for ink that will become the organic film to scatter at the locations where the foreign matters are present, which produces flaws in the organic film. This makes it difficult to ensure the sealing properties of the sealing film, and there is thus a risk that the organic EL display device will be less reliable.

Having been conceived in light of the foregoing point, an object of the disclosure is to suppress the occurrence of flaws in an organic film constituting a sealing film.

Solution to Problem

To achieve the above-described object, a method of manufacturing a display device according to the disclosure is a method of manufacturing a display device including: a light emitting element formation step of forming a light emitting element on one surface of a base substrate; a first inorganic film formation step of forming a first inorganic film covering the light emitting element; an organic film formation step of forming an organic film by ejecting ink, through an ink-jet method, onto the first inorganic film so as to overlap with the light emitting element; and a second inorganic film formation step of forming a sealing film including a second inorganic film, the first inorganic film, and the organic film, by forming the second inorganic film covering the organic film. The method further includes a foreign matter inspection step of inspecting a substrate surface on which the first inorganic film has been formed and identifying the location of a foreign matter adhering to the substrate surface, and a partial ejection step of using an ink-jet method to eject ink to be formed a part of the organic film at the location of the foreign matter on the substrate surface identified in the foreign matter inspection step, the foreign matter inspection step and the partial ejection step being carried out between the first inorganic film formation step and the organic film formation step.

Advantageous Effects of Disclosure

According to the disclosure, the method of manufacturing a display device includes the first inorganic film formation step and the organic film formation step. Between these steps, the method further includes the foreign matter inspection step of inspecting a substrate surface on which the first inorganic film has been formed and identifying the location of a foreign matter adhering to the substrate surface, and the partial ejection step of using an ink-jet method to eject ink to be formed a part of the organic film at the location of the foreign matter on the substrate surface identified in the foreign matter inspection step. Accordingly, the occurrence of flaws in the organic film constituting the sealing film can be suppressed.

DESCRIPTION OF EMBODIMENTS

Embodiments of the disclosure will be described in detail below with reference to the drawings. The disclosure is not limited to the embodiments described below.

First Embodiment

Figure 1:
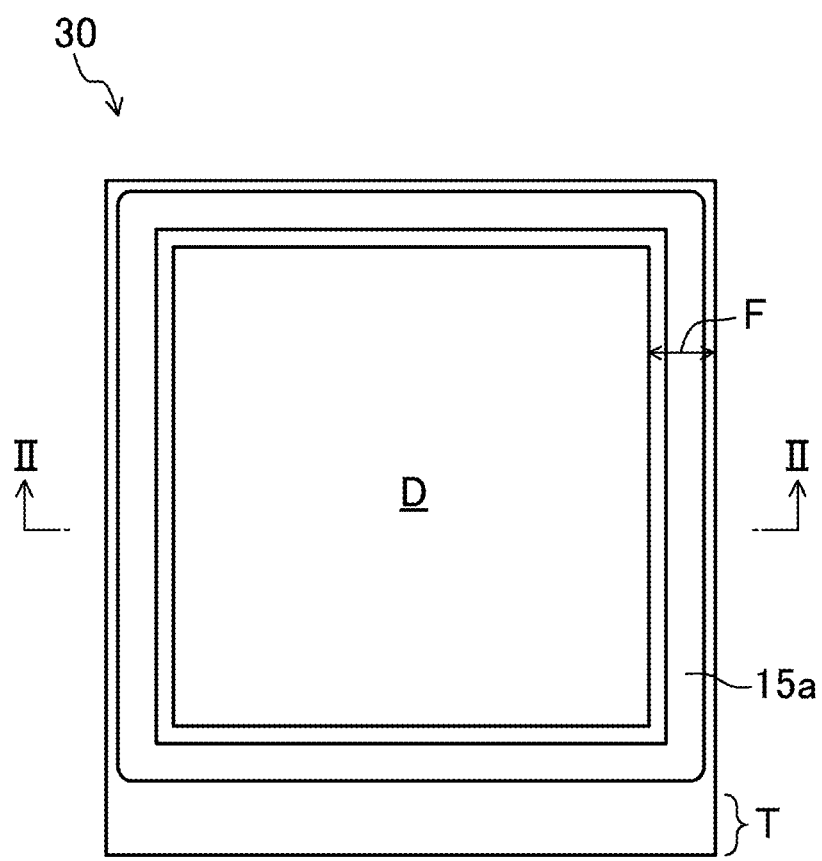
FIG. 1 is a plan view of an organic EL display device according to a first embodiment of the disclosure, schematically illustrating the configuration of the device.
Figure 2:
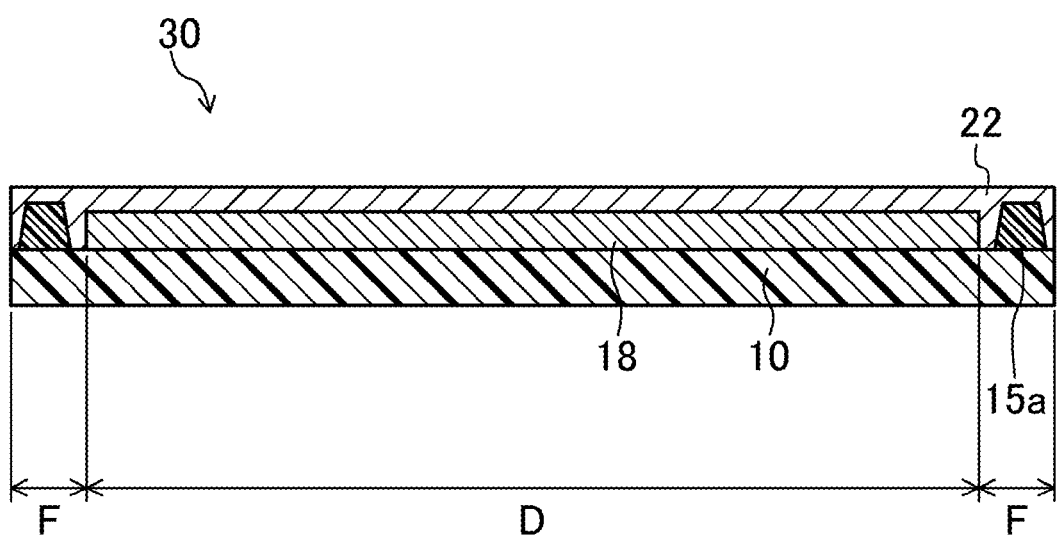
FIG. 2 is a cross-sectional view of the organic EL display device taken along line II-II in FIG. 1, schematically illustrating the configuration of the device.
Figure 3:
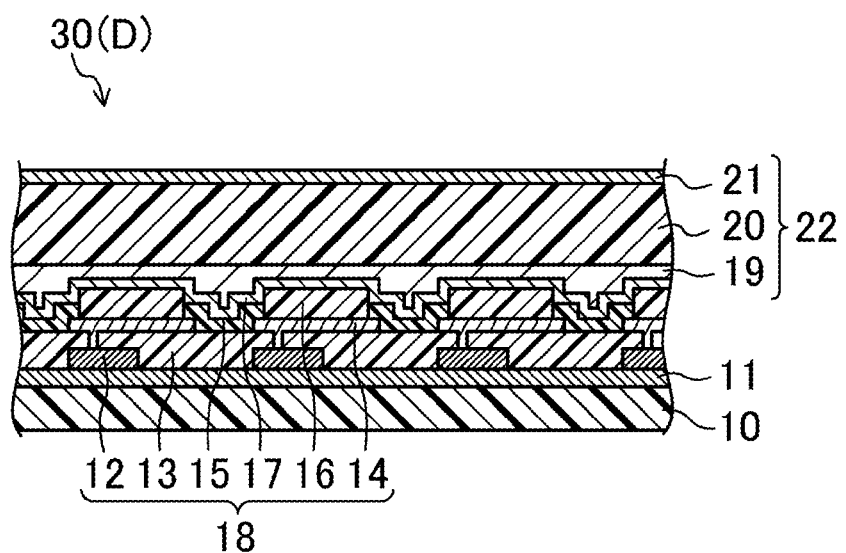
FIG. 3 is a cross-sectional view illustrating, in detail, the configuration of a display region of the organic EL display device according to the first embodiment of the disclosure.
Figure 4:
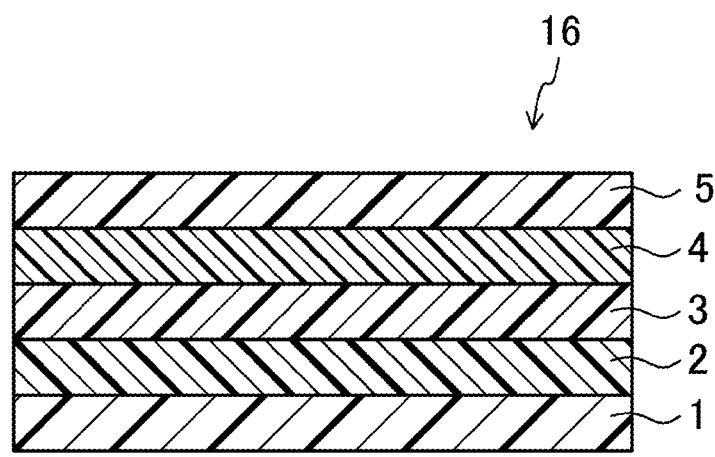
FIG. 4 is a cross-sectional view of an organic EL layer included in the organic EL display device according to the first embodiment of the disclosure.
Figure 5:
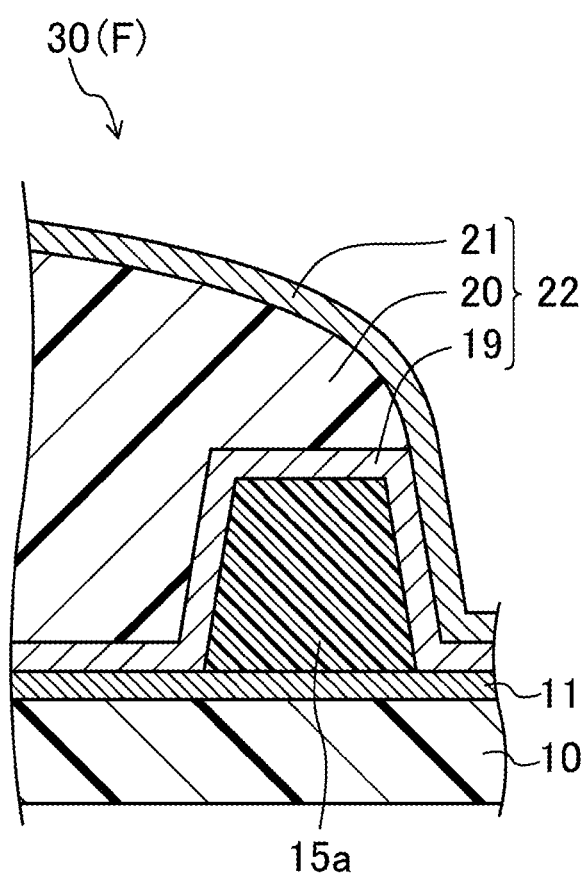
FIG. 5 is a cross-sectional view illustrating, in detail, the configuration of a frame region of the organic EL display device according to the first embodiment of the disclosure.

FIGS. 1 to 7 illustrate the first embodiment of a method of manufacturing a display device according to the disclosure. In the following embodiments, an organic EL display device including an organic EL element will be described as an example of a display device including a light emitting element. Here, FIG. 1 is a plan view of an organic EL display device 30 according to the present embodiment, schematically illustrating the configuration of the device. FIG. 2 is a cross-sectional view of the organic EL display device 30 taken along line II-II in FIG. 1, schematically illustrating the configuration of the device. FIG. 3 is a cross-sectional view illustrating, in detail, the configuration of a display region D in the organic EL display device 30. FIG. 4 is a cross-sectional view of an organic EL layer 16 included in the organic EL display device 30. FIG. 5 is a cross-sectional view illustrating, in detail, a frame region F of the organic EL display device 30.

As illustrated in FIGS. 1 to 3, the organic EL display device 30 includes a base substrate 10, an organic EL element 18, a damming wall 15a, and a sealing film 22. The organic EL element 18 is provided, as a light emitting element, upon the base substrate 10 with a base coating film 11 interposed therebetween, and the sealing film 22 is provided covering the organic EL element 18 and the damming wall 15a. Here, in the organic EL display device 30, the display region D in which images are displayed is defined as a rectangular shape as illustrated in FIG. 1, and in the display region D, a plurality of pixels are arranged in a matrix. Each of the pixels includes a subpixel for displaying a red tone, a subpixel for displaying a green tone, and a subpixel for displaying a blue tone, for example. These subpixels are disposed adjacent to one another. As illustrated in FIG. 1, in the organic EL display device 30, a frame-shaped frame region F is defined in the periphery of the display region D. A terminal portion T is provided at an end part of the frame region F corresponding to the bottom of the drawing.

The base substrate 10 is a plastic substrate including a polyimide resin, for example.

The base coating film 11 is an inorganic insulating film such as a silicon oxide film, a silicon nitride film, a silicon oxynitride film, or the like, for example.

As illustrated in FIG. 2, the organic EL element 18 is provided in the display region D. As illustrated in FIG. 3, the organic EL element 18 includes a plurality of TFTs 12, a flattening film 13, a plurality of first electrodes 14, a partition 15, a plurality of organic EL layers 16, and a second electrode 17, provided in that order on the base coat layer 11.

The TFT 12 is a switching element provided for each of the subpixels in the display region D. Here, the TFTs 12 each include, for example, semiconductor layer, a gate insulating film, a gate electrode, an interlayer insulating film, and source and drain electrodes. The semiconductor layer is provided on the base coating film 11 in an island shape. The gate insulating film is provided covering the semiconductor layer. The gate electrode is provided on the gate insulating film so as to overlap with a part of the semiconductor layer. The interlayer insulating film is provided covering the gate electrode. The source and drain electrodes are arranged separated from each other. In the present embodiment, the top-gate type is described as an example of the TFT 12, but the TFT 12 may be of the bottom-gate type.

As illustrated in FIG. 3, the flattening film 13 is disposed to cover the TFTs 12 except for a portion of each of the drain electrodes, and is provided so as to flatten the surface shape formed by the TFTs 12. Here, the flattening film 13 is composed of a colorless transparent organic resin material such as an acrylic resin, for example.

As illustrated in FIG. 3, the plurality of first electrodes 14 are provided in a matrix over the flattening film 13, corresponding to the plurality of subpixels. Here, as illustrated in FIG. 3, the first electrodes 14 are connected to the respective drain electrodes of the TFTs 12 via respective contact holes formed in the flattening film 13. The first electrode 14 functions to inject holes into the organic EL layer 16. It is more preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the first electrode 14 include alloys, the examples of which include magnesium (Mg)-copper (Cu), magnesium (Mg)-silver (Ag), sodium (Na)-potassium (K), astatine (At)-astatine oxide (AtO$_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 14 include electrically conductive oxides, the examples of which include tin oxide (SnO), zinc oxide (ZnO), indium tin oxide (ITO), and indium zinc oxide (IZO). The first electrode 14 may include a stack of two or more layers of any of the above-mentioned materials. Examples of materials having a large work function include indium tin oxide (ITO) and indium zinc oxide (IZO).

As illustrated in FIG. 3, the partition 15 is disposed in a lattice pattern so as to cover the peripheral portions of each of the first electrodes 14. Examples of materials that may constitute the partition 15 include inorganic films such as silicon oxide (SiO$_2$), silicon nitride (SiNx (x is a positive number)) such as trisilicon tetranitride (Si$_3$N$_4$), and silicon oxynitride (SiON), or organic films such as polyimide resins, acrylic resins, polysiloxane resins, and novolak resins.

As illustrated in FIG. 3, the plurality of organic EL layers 16 are arranged in a matrix on the respective first electrodes 14, and correspond to the respective subpixels. Here, as illustrated in FIG. 4, the organic EL layers 16 each include a hole injection layer 1, a hole transport layer 2, a light-emitting layer 3, an electron transport layer 4, and an electron injection layer 5, which are arranged in that order over the first electrode 14.

The hole injection layer 1 is also referred to as an anode buffer layer, and functions to reduce the energy level difference between the first electrode 14 and the organic EL layer 16 so as to improve the efficiency of hole injection into the organic EL layer 16 from the first electrode 14. Examples of materials that may constitute the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Examples of materials that may constitute the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where, when a voltage is applied via the first electrode 14 and the second electrode 17, holes and electrons are injected from the first electrode 14 and the second electrode 17, respectively, and the holes and the electrons recombine. Here, the light-emitting layer 3 is formed from a material having a high light emitting efficiency. Examples of materials that may constitute the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate the efficient migration of the electrons to the light-emitting layer 3. Examples of materials that may constitute the electron transport layer 4 include organic compounds, the examples of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 5 functions to reduce the energy level difference between the second electrode 17 and the organic EL layer 16, to improve the efficiency of electron injection into the organic EL layer 16 from the second electrode 17. Because of this function, the driving voltage for the organic EL element 18 can be reduced. The electron injection layer 5 is also referred to as a cathode buffer layer. Examples of materials that may constitute the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$); aluminum oxide ($Al_2O_3$); and strontium oxide (SrO).

As illustrated in FIG. 3, the second electrode 17 is provided so as to cover the organic EL layers 16 and the partitions 15, and is provided in common for the plurality of subpixels. The second electrode 17 functions to inject electrons into the organic EL layer 16. It is more preferable that the second electrode 17 includes a material having a small work function to improve the efficiency of electron injection into the organic EL layer 16. Examples of materials that may constitute the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the second electrode 17 include alloys, the examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the second electrode 17 include electrically conductive oxides, the examples of which include tin oxide (SnO), zinc oxide (ZnO), indium tin oxide (ITO), and indium zinc oxide (IZO). The second electrode 17 may include a stack of two or more layers of any of the above-mentioned materials. Examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIGS. 1, 2, and 5, the damming wall 15a is formed in a frame shape in the frame region F so as to surround the organic EL element 18. The damming wall 15a is provided so as to contain ink Lb, which constitutes an organic film 20 (described later) of the sealing film 22. Here, the damming wall 15a is formed in the same layer and from the same material as a partition 15.

As illustrated in FIGS. 3 and 5, the sealing film 22 includes a first inorganic film 19, the organic film 20, and a second inorganic film 21. The first inorganic film 19 is provided so as to cover the organic EL element 18 and the damming wall 15a. The organic film 20 is provided on the first inorganic film 19, overlapping with the organic EL element 18 and an upper surface of the damming wall 15a. The second inorganic film 21 is provided so as to cover the organic film 20 and circumferential end parts of the first inorganic film 19 exposed from the organic film 20.

The first inorganic film 19 is composed of an inorganic insulating film such as a silicon nitride film, a silicon oxide film, a silicon oxynitride film, or the like, for example.

The organic film 20 is composed of an organic resin material such as an acrylate, polyurea, parylene, polyimide, polyamide, or the like, for example.

The second inorganic film 21 is composed of an inorganic insulating film such as a silicon nitride film, a silicon oxide film, a silicon oxynitride film, or the like, for example.

The above-described organic EL display device 30 is flexible. In each of the subpixels, the light-emitting layer 3 of the organic EL layer 16 is caused, via the TFT 12, to emit light as appropriate so as to display images.

Figure 6:
FIG. 6 is a plan view illustrating a substrate in a foreign matter inspection step of a method of manufacturing an organic EL display device according to the first embodiment of the disclosure.
Figure 7A:
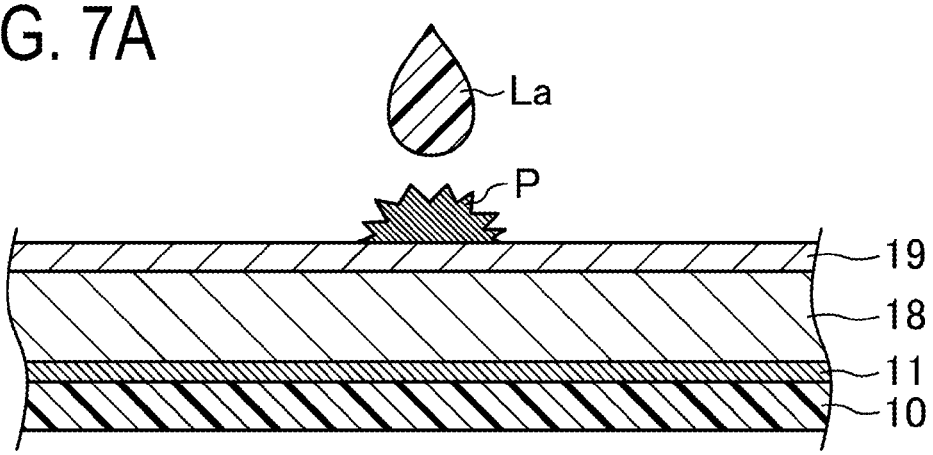
FIGS. 7A to 7C are cross-sectional views illustrating a substrate in a partial ejection step to an organic film formation step in the method of manufacturing an organic EL display device according to the first embodiment of the disclosure.
Figure 7B:
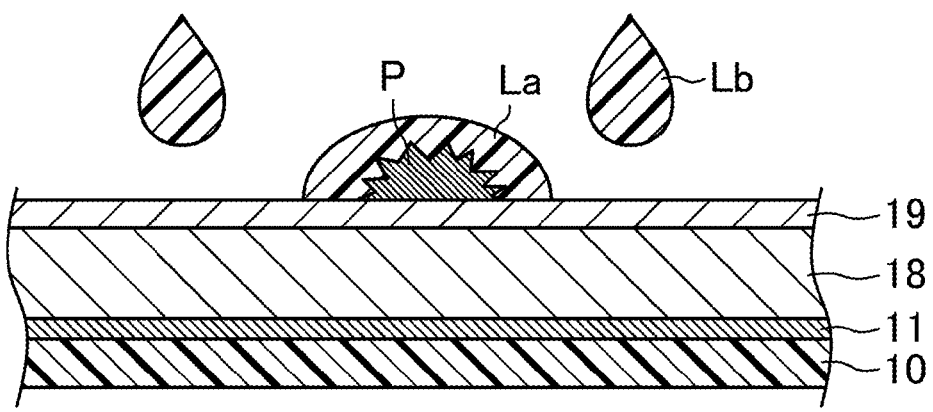
Figure 7C:
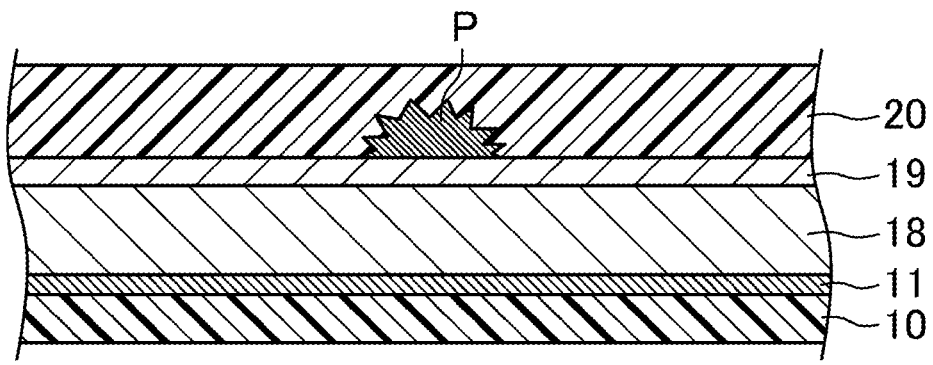

A method of manufacturing the organic EL display device 30 according to the present embodiment will be described next. Here, FIG. 6 is a plan view illustrating a substrate in a foreign matter inspection step of the method of manufacturing the organic EL display device 30. FIGS. 7A to 7C are cross-sectional views illustrating the substrate in a partial ejection step to an organic film formation step of the method of manufacturing the organic EL display device 30. FIG. 7A illustrates the substrate in the partial ejection step. FIG. 7B illustrates the substrate in the organic film formation step. FIG. 7C illustrates the substrate after the organic film formation step. Note that the method of manufacturing the organic EL display device 30 according to the present embodiment includes an organic EL element formation step, a first inorganic film formation step, the foreign matter inspection step, the partial ejection step, the organic film formation step, and a second inorganic film formation step.

Forming Organic EL Element

Using a known method, the base coating film 11, the organic EL element 18 (the TFTs 12, the interlayer insulating film 13, the first electrodes 14, the partition 15, the organic EL layers 16 (the hole injection layer 1, the hole transport layer 2, the light-emitting layer 3, the electron transport layer 4, and the electron injection layer 5), and the second electrode 17), and the damming wall 15a are formed on the surface of the base substrate 10, which is made from a polyimide resin, for example.

First Inorganic Film Formation Step

The first inorganic film 19 is formed by forming an inorganic insulating film such as a silicon nitride film, a silicon oxide film, or a silicon oxynitride film through plasma CVD (chemical vapor deposition), for example, at a thickness of approximately 500 nm, so as to cover the organic EL element 18 formed in the organic EL element formation step.

Foreign Matter Inspection Step

The surface of the first inorganic film 19 formed on the first inorganic film formation step is inspected using an automated optical inspection (AOI) device including a CCD (charge coupled device) camera. As illustrated in FIG. 6, the locations of foreign matters P adhering to the surface of the first inorganic film 19 are identified.

Partial Ejection Step

As illustrated in FIG. 7A, ink La of an organic resin material such as an acrylate, polyurea, parylene, polyimide, polyamide, or the like, for example, is ejected through an ink-jet method at the locations of the foreign matters P identified in the foreign matter inspection step. Here, each droplet of the ink La contains approximately 10 pL, and the viscosity of the ink La is approximately 0.01 Pa·s. The ejection frequency of the ink La is from approximately several kHz to approximately several tens of kHz, for example. The ejection voltage of the ink La is from approximately 7 V to approximately 15 V, for example. The ejection velocity of the ink La is approximately from 8 m/s to approximately 10 m/s. Note that before the ink La is ejected, the meniscus of the ink La within the nozzle may be vibrated to make it easier to eject the first droplet. Furthermore, the viscosity of the ink La (e.g., 0.02 Pa·s) may be set higher than the viscosity of the ink Lb (e.g., 0.01 Pa·s), which will be described later, in order to reliably deposit the ink La on the foreign matters P. Additionally, the ejection velocity of the ink La (e.g., 10 m/s) may be set to be higher than the ejection velocity of the ink Lb (e.g., 8 m/s), which will be described later, in order to reliably deposit the ink La on the foreign matters P.

Organic Film Formation Step

An organic layer 20 such as that illustrated in FIG. 7C, having a thickness of from approximately 3 μm to approximately 10 μm, is formed by ejecting the ink Lb, which is composed of an organic resin material such as an acrylate, polyurea, parylene, polyimide, or polyamide, for example, through an ink-jet method, as illustrated in FIG. 7B. Here, the ink Lb is ejected on the inner sides of the frame-shaped damming wall 15a, on the substrate onto which the ink La has been ejected in the above-described partial ejection step. Here, each droplet of the ink Lb contains approximately 10 pL, and the viscosity of the ink Lb is approximately 0.01 Pa·s. The ejection frequency of the ink Lb is from approximately several kHz to approximately several tens of kHz, for example. The ejection voltage of the ink Lb is from approximately 7 V to approximately 15 V, for example. The ejection velocity of the ink Lb is approximately from 8 m/s to approximately 10 m/s. The pitch of the ink Lb in a direction orthogonal to a substrate transport direction (the horizontal direction, in FIGS. 7A to 7C) is from approximately 10 μm to approximately several tens of μm. Note that the flatness of the surface of the organic layer 20 may be improved by setting the amount of the ink Lb to be lower in parts where the ink La was ejected in the partial ejection step than in parts where the ink La was not ejected in the partial ejection step.

Second Inorganic Film Formation Step

The second inorganic film 21 is formed by, for example, forming an inorganic insulating film such as silicon nitride film, silicon oxide film, or silicon oxynitride film at a thickness of approximately 500 nm through plasma CVD or the like so as to cover the organic layer 20 formed in the above-described organic film formation step. The sealing film 22 composed of the first inorganic film 19, the organic film 20, and the second inorganic film 21 is formed as a result.

The organic EL display device 30 of the present embodiment can be manufactured in this manner.

As described thus far, according to the method of manufacturing the organic EL display device 30 of the present embodiment, first, the surface of the first inorganic film 19 formed in the first inorganic film formation step is inspected in the foreign matter inspection step to identify the locations of foreign matters P adhering to the surface of the first inorganic film 19. Then, in the partial ejection step, the ink La is ejected through an ink-jet method at the locations of the foreign matters P on the surface of the first inorganic film 19, identified in the foreign matter inspection step. The ink La is deposited directly onto the foreign matters P, and thus scattering of the ink La at the foreign matters P can be suppressed. The ink Lb is then ejected through an ink-jet method in the organic film formation step. The ink La deposited onto the foreign matters P combines with the many droplets of the ink Lb deposited in the periphery of the ink La, which makes it possible to form a uniformly-spread film. Furthermore, a uniform organic film 20 can be formed after the spread film has dried, and thus the occurrence of flaws in the organic film 20 constituting the sealing film 22 can be suppressed. The sealing properties of the sealing film 22 can therefore be improved, which makes it possible to improve the reliability of the organic EL display device 30.

Second Embodiment

Figure 8:
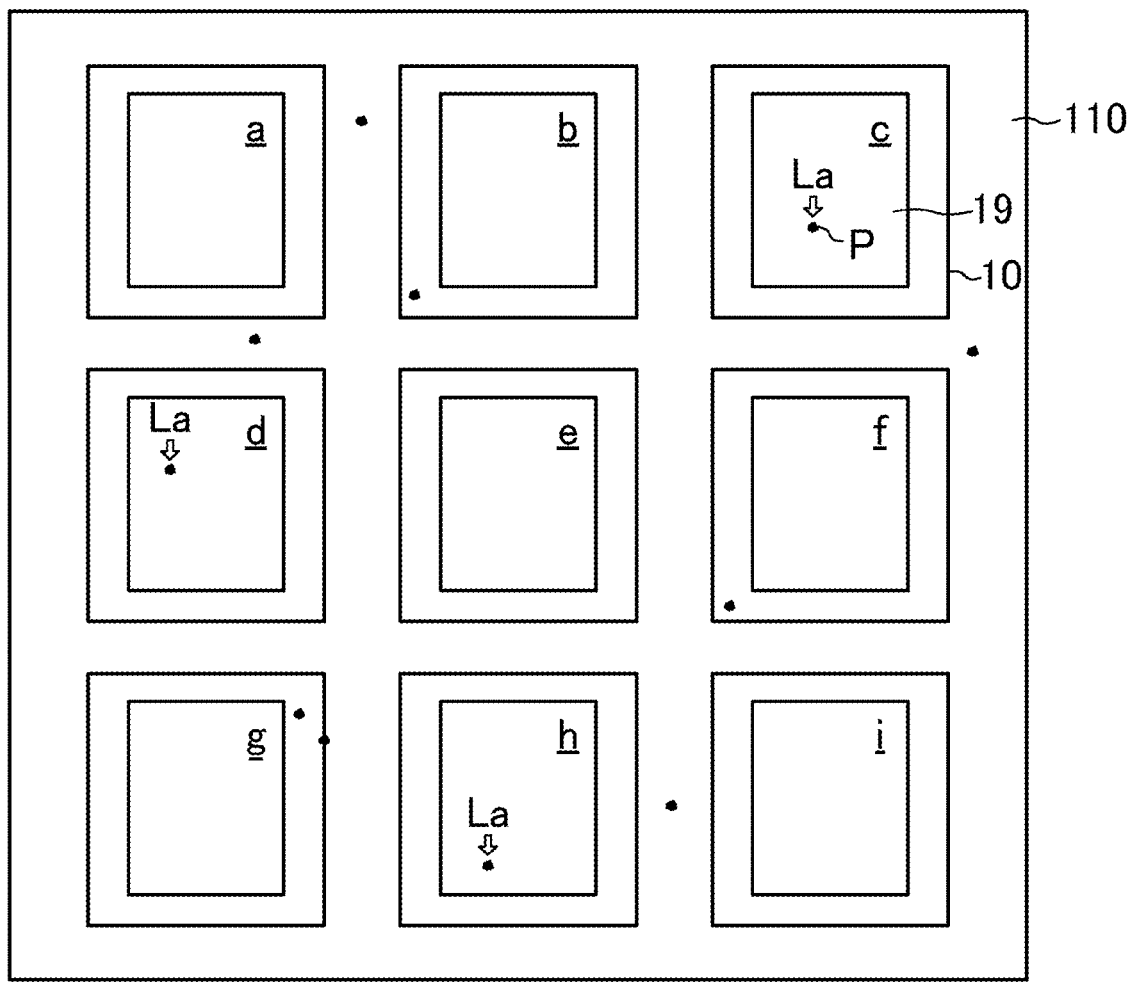
FIG. 8 is a plan view illustrating a mother substrate in a partial ejection step in a method of manufacturing an organic EL display device according to a second embodiment of the disclosure.

FIG. 8 illustrates the second embodiment of a method of manufacturing a display device according to the disclosure. Here, FIG. 8 is a plan view of a mother substrate 110 in the partial ejection step of the method of manufacturing the organic EL display device 30 according to the present embodiment. In the following embodiment, parts identical to those in FIGS. 1 to 7C are designated by the same reference characters, and detailed descriptions thereof will be omitted.

The foregoing first embodiment describes a method of manufacturing the organic EL display device 30 when the device is manufactured as a single unit. However, the present embodiment will describe a method of manufacturing the organic EL display device 30 when multiple devices are manufactured at the same time.

The method of manufacturing the organic EL display device 30 according to the present embodiment includes an organic EL element formation step, a first inorganic film formation step, the foreign matter inspection step, the partial ejection step, the organic film formation step, and a second inorganic film formation step. Here, the foreign matter inspection step includes a location information acquisition step and a selection step. With respect to the organic EL element formation step, the first inorganic film formation step, the organic film formation step, and the second inorganic film formation step, the processes described in the foregoing first embodiment are simply carried out at the same time in multiple. As such, detailed descriptions thereof will be omitted, and the present embodiment will instead focus primarily on the foreign matter inspection step and the partial ejection step.

Foreign Matter Inspection Step

First, the first inorganic film formation step described in the foregoing first embodiment is carried out for the mother substrate 110, in which the base substrates 10 are arranged in a matrix. Then, the substrate surface on which a plurality of the first inorganic films 19 are formed is inspected using an automated optical inspection device including a CCD camera to identify the locations of foreign matters P adhering to the substrate surfaces, as illustrated in FIG. 8.

Next, allocation location information is acquired for regions, of the regions where the plurality of first inorganic films 19 have been formed on the mother substrate 110 in the first inorganic film formation step, that are on the inner sides of the damming wall 15a (a region a to a region i in FIG. 8) (the location information acquisition step).

Only the locations of foreign matters P overlapping with the allocation location information acquired in the above-described location information acquisition step are then selected (the foreign matters P located in region c, region d, and region h in FIG. 8) (the selection step).

Partial Ejection Step

The ink La of an organic resin material such as an acrylate, polyurea, parylene, polyimide, polyamide, or the like, for example, is ejected through an ink-jet method at only the locations of the foreign matters P selected in the selection step of the foreign matter inspection step (the foreign matters P in region c, region d, and region h in FIG. 8).

Then, by carrying out the organic film formation step and the second inorganic film formation step described in the foregoing first embodiment in multiple and lastly cutting the mother substrate 110 into individual base substrates 10, a plurality of organic EL display devices 30 can be manufactured.

As described thus far, according to the method of manufacturing the organic EL display device 30 of the present embodiment, first, in the foreign matter inspection step, the surfaces of the substrates on which a plurality of the first inorganic films 19 have been formed in the first inorganic film formation step are inspected. The locations of foreign matters P adhering to the substrate surfaces are then identified. The allocation location information is acquired for regions, of the regions where the plurality of first inorganic films 19 have been formed on the mother substrate 110, that are on the inner sides of the damming wall 15a. Then, only the locations of the foreign matters P overlapping with that allocation location information are selected. Next, in the partial ejection step, the ink La is ejected through an ink-jet method only at the locations of the foreign matters P selected in the foreign matter inspection step, and the ink La is deposited directly onto the foreign matters P. Accordingly, scattering of the ink La at the foreign matters P can be suppressed. The ink Lb is then ejected through an ink-jet method in the organic film formation step. The ink La deposited onto the foreign matters P combines with the droplets of the ink Lb deposited in the periphery of the ink La, which makes it possible to form a uniformly-spread film. Furthermore, a uniform organic film 20 can be formed after the spread film has dried, and thus the occurrence of flaws in the organic film 20 constituting the sealing film 22 can be suppressed. The sealing properties of the sealing film 22 can therefore be improved, which makes it possible to improve the reliability of the organic EL display device 30.

Additionally, according to the method of manufacturing the organic EL display device 30 of the present embodiment, the ink La is ejected, through an ink-jet method, only onto the foreign matters P adhering to the surface of the first inorganic film 19 in the partial ejection step. Accordingly, the manufacturing efficiency can be improved as compared to a case where the ink La is ejected onto all the foreign matters P adhering to the surfaces of the substrates.

Other Embodiments

In the embodiments described above, the example of the organic EL layer including the five-layer structure including the hole injection layer, the hole transport layer, the light-emitting layer, the electron transport layer, and the electron injection layer is given. It is also possible that, for example, the organic EL layer may include a three-layer structure including a hole injection-cum-transport layer, a light-emitting layer, and an electron transport-cum-injection layer.

In the embodiments described above, the example of the organic EL display devices including the first electrode as an anode and the second electrode as a cathode is given. However, the disclosure is also applicable to an organic EL display device, in which the layers of the structure of the organic EL layer are in reverse order, with the first electrode being a cathode and the second electrode being an anode.

In the embodiments described above, the example of the organic EL display devices including the element substrate, in which the electrode of the TFT connected to the first electrode is the drain electrode, is given. However, the disclosure is also applicable to an organic EL display device including an element substrate, in which the electrode of the TFT connected to the first electrode is referred to as the source electrode.

Additionally, in the embodiments described above, an example of an organic EL display device using a plastic substrate as the base substrate is given. However, the disclosure can also be applied to an organic EL display device using a glass substrate as the base substrate.

Although the foregoing embodiments describe organic EL display devices as examples of display devices, the disclosure can be applied to display devices including a plurality of light emitting elements that are driven by an electrical current. For example, the disclosure is applicable to display devices including quantum-dot light emitting diodes (QLEDs), which are light emitting elements using a quantum dot-containing layer.

INDUSTRIAL APPLICABILITY

As described above, the disclosure is applicable to flexible display devices.

REFERENCE SIGNS LIST

La, Lb Ink
P Foreign matter
10 Base substrate
15a Damming wall
18 Organic EL element (light emitting element)
19 First inorganic film
20 Organic film
21 Second inorganic film
22 Sealing film
30 Organic EL display device

The invention claimed is:

1. A method of manufacturing a display device, the method comprising:
   a light emitting element formation step of forming a light emitting element on one surface of a base substrate;
   a first inorganic film formation step of forming a first inorganic film covering the light emitting element;
   an organic film formation step of forming an organic film by ejecting ink, through an ink-jet method, onto the first inorganic film so as to overlap with the light emitting element; and
   a second inorganic film formation step of forming a sealing film including a second inorganic film, the first inorganic film, and the organic film, by forming the second inorganic film covering the organic film,
   wherein the method further comprises a foreign matter inspection step of inspecting a substrate surface on which the first inorganic film has been formed and identifying a location where a foreign matter adheres to the substrate surface, and a partial ejection step of using an ink-jet method to eject ink to be formed in a portion of the organic film at the location of the foreign matter on the substrate surface identified in the foreign matter inspection step, the foreign matter inspection step and the partial ejection step being carried out between the first inorganic film formation step and the organic film formation step.

2. The method of manufacturing a display device according to claim 1,
   wherein a damming wall is provided surrounding the light emitting element;
   the foreign matter inspection step includes:
   a location information acquisition step of acquiring allocation location information of a region, among regions in which the first inorganic film has been formed in the first inorganic film formation step, on an inner side of the damming wall; and
   a selection step of selecting only the location of a foreign matter overlapping with the allocation location information acquired in the location information acquisition step, and
   in the partial ejection step, the ink is ejected only at the location of the foreign matter selected in the selection step.

3. The method of manufacturing a display device according to claim 1,
   wherein a viscosity of the ink ejected in the partial ejection step is higher than a viscosity of the ink ejected in the organic film formation step.

4. The method of manufacturing a display device according to claim 1,
   wherein an ejection velocity of the ink ejected in the partial ejection step is higher than an ejection velocity of the ink ejected in the organic film formation step.

5. The method of manufacturing a display device according to claim 1,
   wherein in the organic film formation step, less ink is used in portions where the ink was ejected in the partial ejection step than in portions where the ink was not ejected in the partial ejection step.

6. The method of manufacturing a display device according to claim 1,
   wherein in the partial ejection step, a meniscus of the ink is caused to move before ejecting the ink.

7. The method of manufacturing a display device according to claim 1,
   wherein the light emitting element is an organic EL element.

* * * * *